(12) United States Patent
Chen et al.

(10) Patent No.: US 7,274,189 B2
(45) Date of Patent: Sep. 25, 2007

(54) SENSOR AND METHOD

(75) Inventors: Weihua Chen, Westford, MA (US); Saeed Shafiyan-Rad, Nashua, NH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 293 days.

(21) Appl. No.: 10/936,956

(22) Filed: Sep. 9, 2004

(65) Prior Publication Data

US 2006/0049827 A1 Mar. 9, 2006

(51) Int. Cl.
*G01B 7/14* (2006.01)
(52) U.S. Cl. .................................. 324/207.26
(58) Field of Classification Search ........... 324/207.11, 324/207.12, 207.15, 207.16, 207.26
See application file for complete search history.

(56) References Cited

U.S. PATENT DOCUMENTS

| | | | |
|---|---|---|---|
| 3,720,934 A * | 3/1973 | Sibeud | 340/870.18 |
| 4,385,297 A * | 5/1983 | Schmitt et al. | 340/870.31 |
| 6,208,134 B1 * | 3/2001 | Demma | 324/207.26 |
| 6,600,133 B2 * | 7/2003 | Watanabe et al. | 219/125.1 |
| 6,617,845 B1 | 9/2003 | Shafiyan-Rad et al. | 324/207.16 |
| 6,984,994 B2 * | 1/2006 | Gregg | 324/655 |
| 2006/0061351 A1 | 3/2006 | Chen et al. | |

FOREIGN PATENT DOCUMENTS

GB        2067765 A * 7/1981

* cited by examiner

*Primary Examiner*—Edward Lefkowitz
*Assistant Examiner*—Kenneth J Whittington
(74) *Attorney, Agent, or Firm*—Catherine Klima-Silberg; William R. Walbrun

(57) ABSTRACT

An apparatus includes a first circuit, a second circuit, and a capacitor. The first circuit includes a sense element. The capacitor couples the first circuit to the second circuit. The first feedback path couples the second circuit to the first circuit. And the second feedback path couples the second circuit to the first circuit. A method includes generating, for an oscillator signal having an amplitude and a gain, a substantially direct current signal related to an amplitude, and controlling the gain with the substantially direct current signal.

20 Claims, 5 Drawing Sheets

SENSOR AND METHOD

TECHNICAL FIELD

Sensors for use in detecting targets, and more particularly, sensors for use in detecting targets in the presence of an alternating current field, such as experienced in a welding operation.

TECHNICAL BACKGROUND

Sensors, such as proximity sensors, are used in industrial machinery, such as welding equipment and industrial robots. Proximity sensors detect the presence of targets, such as targets formed from ferrous and non-ferrous materials. Proximity sensors are used to detect the presence of both stationary and non-stationary targets. A table for holding a work piece to be welded, such as a door panel, is an example of a stationary target. To detect a table a proximity sensor is moved toward the table until the table is detected. A moving robotic arm, such as a robotic arm moving a work piece, such as a door panel, onto a table is an example of a non-stationary target. A moving robotic arm is detected as it moves to a position near a proximity sensor.

Unfortunately, some environments in which proximity sensors are used are electromagnetically noisy environments. For example, sensors are used in environments that include arc welders. Arc welders create an alternating current or direct current environment. Some sensors fail when used in an alternating current or direct current electromagnetic field environment. A failed sensor can cause manufacturing lines to shut down or industrial machinery to malfunction. For these and other reasons there is a need for sensors that do not fail in the presence of electrical noise or an alternating current or direct current magnetic field.

SUMMARY

An apparatus includes a first circuit including a sense element, a second circuit, and a capacitor to couple the first circuit to the second circuit. The apparatus further includes a first feedback path to couple the second circuit to the first circuit and a second feedback path to couple the second circuit to the first circuit. Several options of the apparatus are provided. In one option, the first circuit and the second circuit are to produce a substantially periodic signal. In another option, the sense element is connected in parallel with a capacitor. In another option, the first feedback path is to provide a substantially periodic signal to the first circuit. In another option, the second feedback path is to provide an amplitude compensation signal to the first circuit. In another option, the amplitude compensation signal is to amplitude compensate the substantially periodic signal when noise or alternating current or direct current magnetic field is detected in the sense element. In another option, the noise or an alternating current magnetic field has a frequency of about sixty hertz. In another option, the amplitude compensation signal comprises a substantially direct current signal. In another option, the periodic signal has an amplitude and the amplitude compensation signal is related to the amplitude. In another option, the capacitor is to block noise or an alternating current magnetic field having a frequency of substantially sixty hertz. In another option, the sense element comprises a coil including a magnetic core. In another option, the magnetic core comprises a ferromagnetic material.

A method is provided that includes generating, for an oscillator signal having an amplitude and a gain, a substantially direct current signal related to an amplitude, and controlling the gain with the substantially direct current signal. Several options of the method are provided. In one option, for the oscillator signal having the amplitude and the gain, generating the substantially direct current signal related to the amplitude, comprises filtering the oscillator signal. In another option, the method further includes controlling the gain in response to noise or an alternating current or direct current magnetic field in a sense element.

A system is provided that includes a first circuit including a sense element, a second circuit, a capacitor to couple the first circuit to the second circuit and a first feedback path to couple the second circuit to the first circuit and a second feedback path to couple the second circuit to the first circuit, and a target to be detected by the sense element. Several options are provided. In one option, the oscillator generates an oscillator signal and a gain control signal and the oscillator amplitude compensates the oscillator signal when noise or an alternating current or direct current magnetic field is detected in the sense element and a target is detected by the sense element. In another option, the target comprises a moveable structure to be detected by the sense element. In still another option, the moveable structure includes a welding unit. In another option, the target comprises a stationary structure to be detected by the sense element. In another option, the stationary structure comprises an arc welding unit.

These and other embodiments, aspects, advantages, and features will be set forth in part in the description which follows, and in part will become apparent to those skilled in the art by reference to the following description and referenced drawings or by practice thereof. The aspects, advantages, and features are realized and attained by means of the instrumentalities, procedures, and combinations particularly pointed out in the appended claims and their equivalents.

DESCRIPTION OF THE EMBODIMENTS

In the following detailed description, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. Therefore, the following detailed description is not to be taken in a limiting sense, and the scope is defined by the appended claims.

Figure 1A:
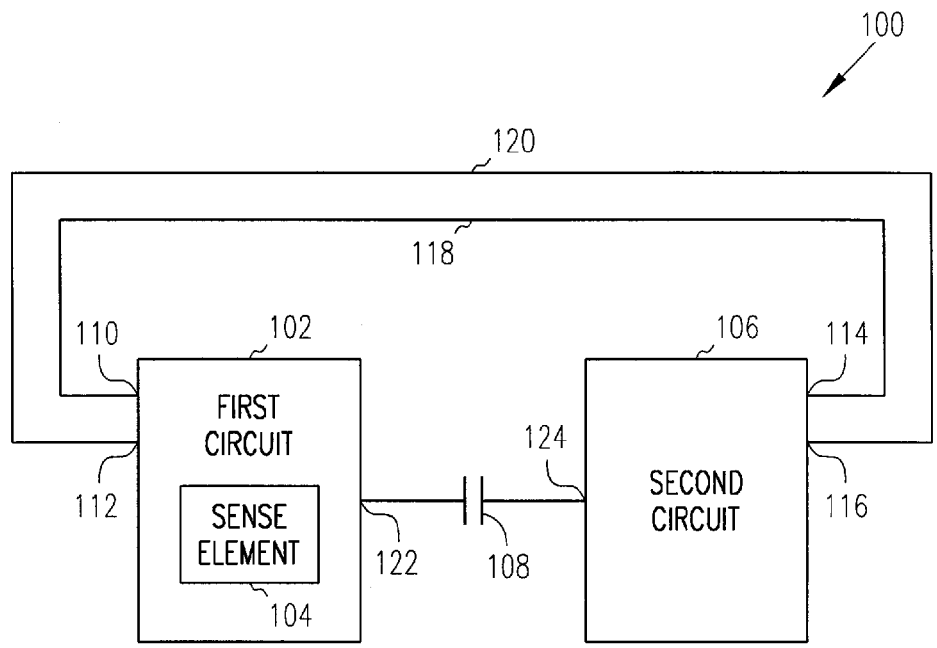
FIG. 1A illustrates a block diagram of an apparatus including a first circuit, a sense element, a second circuit, and a capacitor to couple the first circuit to the second circuit in accordance with one embodiment.

FIG. 1A illustrates a block diagram of an apparatus 100 including a first circuit 102, a sense element 104, a second circuit 106, and a capacitor 108 to couple the first circuit 102 to the second circuit 104 in accordance with one embodiment. The first circuit 102 includes feedback ports 110 and 112. The second circuit 106 includes feedback ports 114 and 116. The apparatus 100 further includes a first feedback path 118 to couple the second circuit 106 at the feedback port 114 to the first circuit 102 at the feedback port 110. The apparatus 100 includes a second feedback path 120 to couple the second circuit 106 at the feedback port 116 to the first circuit 102 at the feedback port 112. The first circuit 102 includes a first circuit port 122. The second circuit 106 includes a second circuit port 124. The capacitor 108 couples the first circuit port 122 to the second circuit port 124. The capacitor 108 blocks noise from being coupled to the second circuit 106. In some embodiments, the capacitor 108 blocks noise having a frequency of sixty hertz.

Figure 1B:
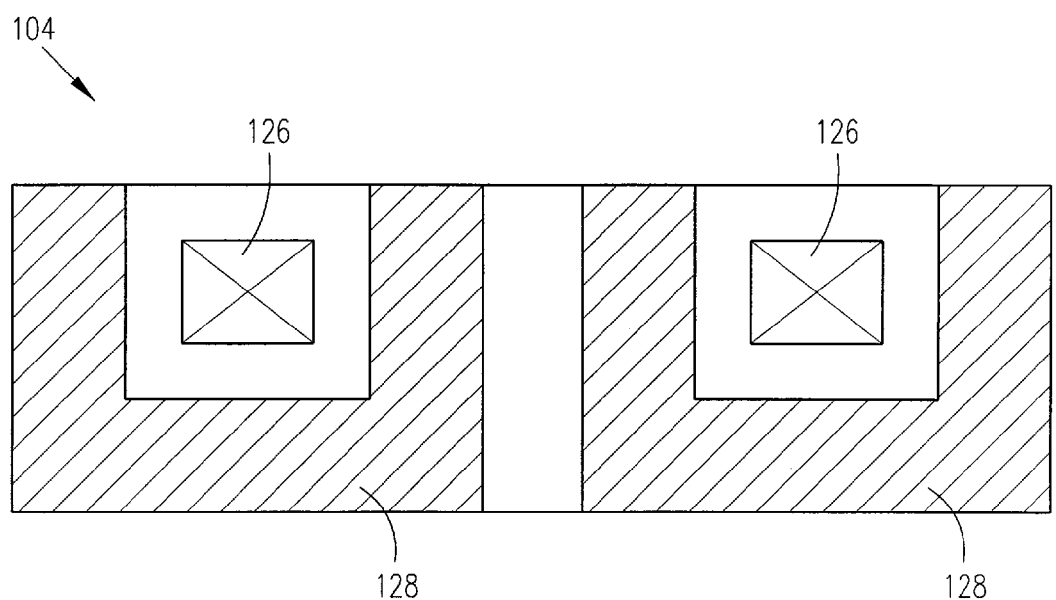
FIG. 1B illustrates the sense element, shown in FIG. 1A, including a coil and a magnetic core in accordance with one embodiment.

FIG. 1B illustrates the sense element 104, shown in FIG. 1A, including a coil 126 and a magnetic core 128 in accordance with one embodiment. A conductive material, such as a litzt wire, which is a woven wire, is suitable for use in the fabrication of the coil 126. In some embodiments, the coil 126 is a discrete coil. In some embodiments, the coil 126 is an integrated circuit coil and fabricated on a printed circuit board. An integrated circuit coil is a coil fabricated with the same processes, such as the processes used to form the integrated circuits coupled to the coil, and on the same printed circuit board as the integrated circuits coupled to the coil. Ferrite, a ferromagnetic material, is an exemplary material suitable for use in connection with the fabrication of the magnetic core 128. Ferrite is suitable for use as a core material for a discrete coil or for an integrated circuit coil.

Referring again to FIG. 1A, in operation, the first circuit 102 and the second circuit 106 produce a substantially periodic signal. The first feedback path 118 provides a substantially periodic signal to the first circuit 102. The second feedback path 120 provides an amplitude compensation signal to the first circuit 102. The amplitude compensation signal includes a substantially direct current signal. A substantially direct current signal is a current signal that has a frequency spectrum that is substantially free of non-zero frequency components. The amplitude compensation signal is related to the amplitude of the substantially periodic signal. The amplitude compensation signal amplitude compensates the substantially periodic signal when noise or an alternating current or direct current magnetic field is detected in the sense element 104. If noise or an alternating current or direct current magnetic field suppresses the amplitude of the substantially periodic signal, then the amplitude compensation signal boosts the amplitude of the substantially periodic signal. In some embodiments, the noise or an alternating current magnetic field has a frequency of about sixty hertz.

Figure 2:
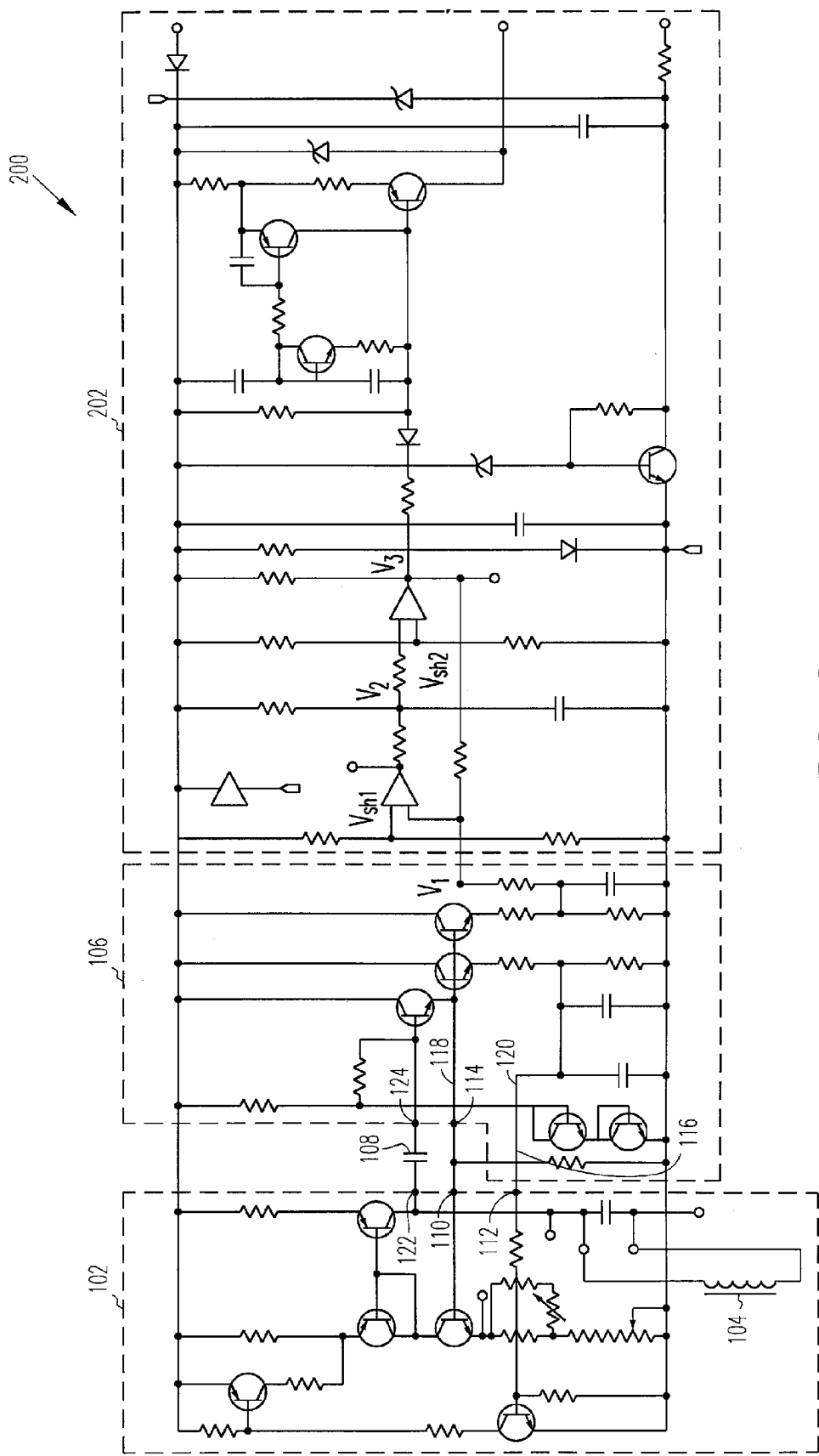
FIG. 2 illustrates a schematic diagram of an apparatus including the first circuit, shown in FIG. 1A, the sense element, shown in FIG. 1A, the second circuit, shown in FIG. 1A, and the capacitor, shown in FIG. 1A, to couple the first circuit to the second circuit, and an interface circuit in accordance with one embodiment.

FIG. 2 illustrates a schematic diagram of an apparatus 200 including the first circuit 102, shown in FIG. 1A, the sense element 104, shown in FIG. 1A, the second circuit 106, shown in FIG. 1A, and the capacitor 108, shown in FIG. 1A, to couple the first circuit 102 to the second circuit 106, and an interface circuit 202 in accordance with one embodiment. The first circuit 102 includes feedback ports 110 and 112. The second circuit 106 includes feedback ports 114 and 116. The apparatus 100 further includes a first feedback path 118 to couple the second circuit 106 at the feedback port 114 to the first circuit 102 at the feedback port 110. The apparatus 200 includes a second feedback path 120 to couple the second circuit 106 at the feedback port 116 to the first circuit 102 at the feedback port 112. The first circuit 102 includes a first circuit port 122. The second circuit 106 includes a second circuit port 124. The capacitor 108 couples the first circuit port 122 to the second circuit port 124. The capacitor 108 blocks noise from being coupled to the second circuit 106. In some embodiments, the capacitor 108 blocks noise having a frequency of sixty hertz.

The interface circuit 202 receives and processes a substantially periodic signal to provide a target detected signal at the apparatus output port 204. In some embodiments, interface circuit 202 includes comparators and current output circuits at the output port 204.

Figure 3:
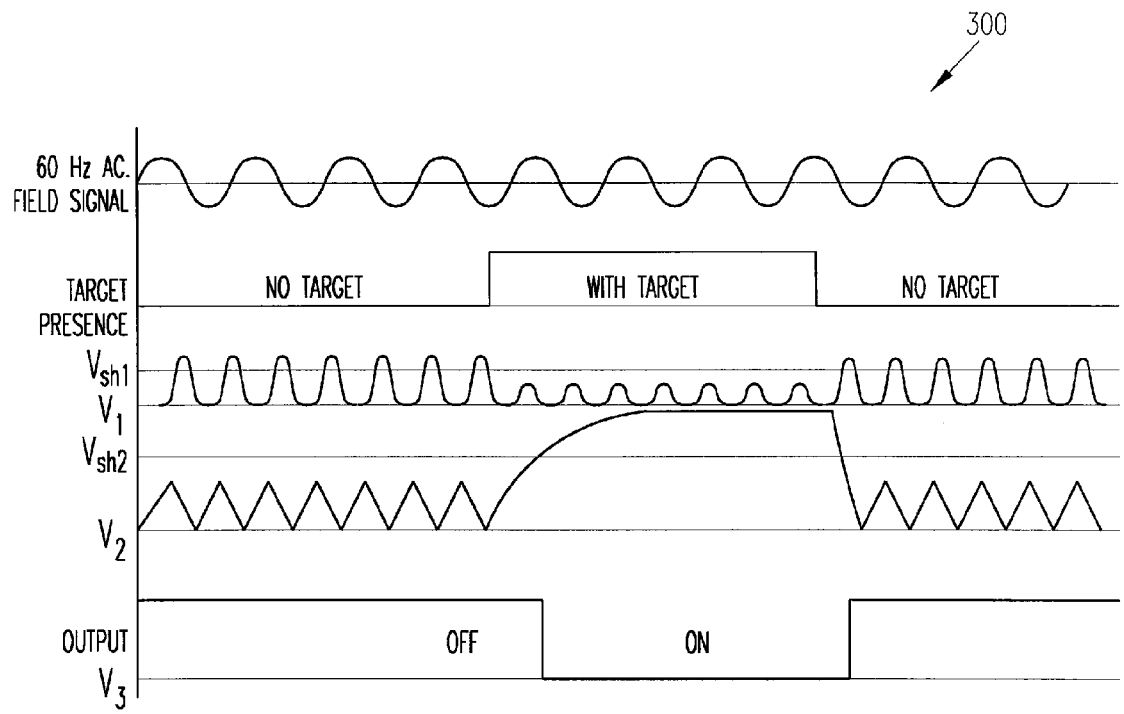
FIG. 3 illustrates a timing diagram for signals generated during the operation of the apparatus illustrated in the schematic diagram shown in FIG. 2 in accordance with one embodiment.

FIG. 3 illustrates a timing diagram 300 for signals generated during the operation of the apparatus 200 illustrated in the schematic diagram shown in FIG. 2 in accordance with one embodiment. Referring again to FIG. 2, the nodes V1, V2, V3, Vsh1, and Vsh2 are shown in FIG. 2. Referring again to FIG. 3, the signals, as shown in FIG. 3 are associated with the nodes V1, V2, V3, Vsh1, and Vsh2 of FIG. 2. As can be seen in FIG. 3, V1, a substantially periodic signal, decreases in amplitude when a target is present, which is indicated by a positive active target "present" signal, shown in FIG. 3. When a target is present, V1 drops below Vsh1, which allows V2 to increase in amplitude beyond the threshold Vsh2. When V2 crosses threshold Vsh2, V3, the output signal of the apparatus 200, shown in FIG. 2, turns on. The apparatus 200, shown in FIG. 2, provides for the detection and generation of a signal in the presence of noise or an alternating current magnetic field, such as the sixty hertz field signal, also shown in FIG. 3.

Figure 4:
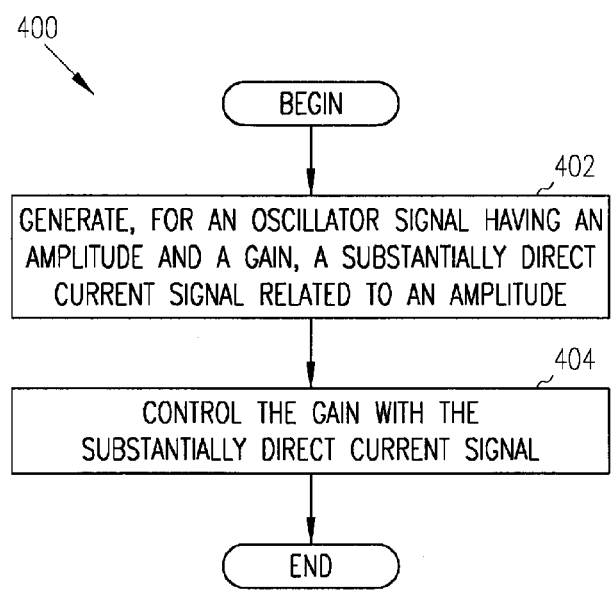
FIG. 4 illustrates a flow diagram of a method for compensating for noise or an alternating current or direct current magnetic field in an oscillator signal in accordance with one embodiment.

FIG. 4 illustrates a flow diagram of a method 400 for compensating for noise or an alternating current magnetic field in an oscillator signal in accordance with one embodiment. The method 400 includes generating, for an oscillator signal having an amplitude and a gain, a substantially direct current signal related to an amplitude (block 402), and controlling the gain with the substantially direct current signal (block 404). In some embodiments, generating, for the oscillator signal having the amplitude and the gain, the substantially direct current signal related to the amplitude, includes filtering the oscillator signal. In some embodiments, the method 400 further includes controlling the gain in response to noise or an alternating current magnetic field in a sense element.

Figure 5:
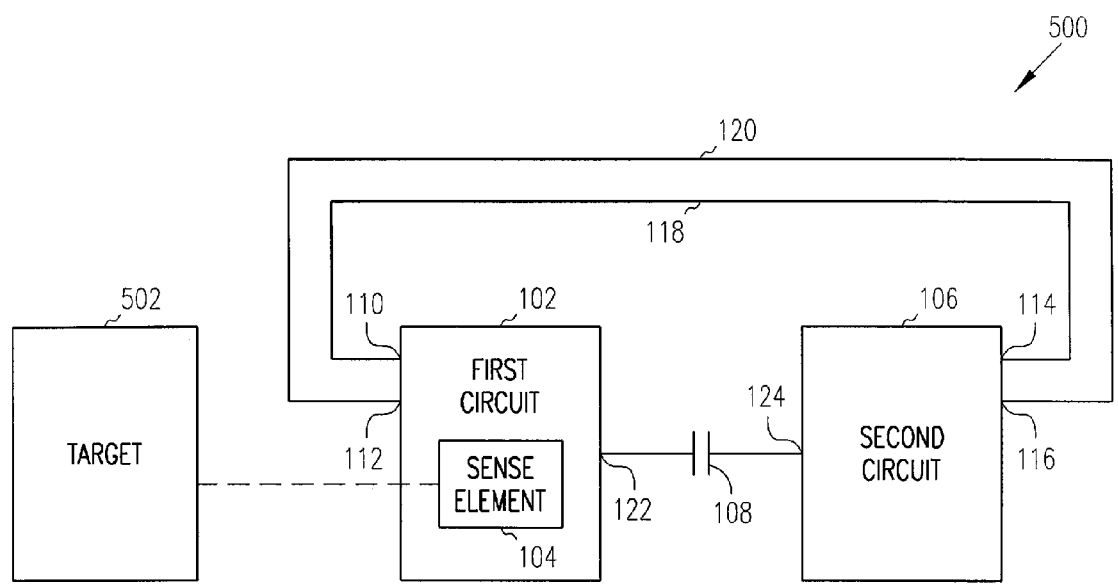
FIG. 5 illustrates a block diagram of a system including the first circuit, shown in FIG. 1A, the sense element, shown in FIG. 1A, the second circuit, shown in FIG. 1A, and the capacitor, shown in FIG. 1A, to couple the first circuit to the second circuit, and a target in accordance with one embodiment.

FIG. 5 illustrates a block diagram of a system 500 including the first circuit 102, shown in FIG. 1A, the sense element 104, shown in FIG. 1A, the second circuit 106, shown in FIG. 1A, and the capacitor 108, shown in FIG. 1A, to couple the first circuit 102 to the second circuit 106, and a target 502 in accordance with one embodiment. The first circuit 102 includes feedback ports 110 and 112. The second circuit 106 includes feedback ports 114 and 116. The apparatus 100 further includes a first feedback path 118 to couple the second circuit 106 at the feedback port 114 to the first circuit 102 at the feedback port 110. The apparatus 100 includes a second feedback path 120 to couple the second circuit 106 at the feedback port 116 to the first circuit 102 at the feedback port 112. The first circuit 102 includes a first circuit port 122. The second circuit 106 includes a second circuit port 124. The capacitor 108 couples the first circuit port 122 to the second circuit port 124. The apparatus 100 further includes a first feedback path 118 to couple the second circuit 106 to the first circuit 102 and a second feedback path 112 to couple the second circuit 106 to the first circuit 102.

The target 502 is not limited to a particular target. In some embodiments, the target 502 includes a moveable structure to be detected by the sense element 104. In some embodiments, the moveable structure includes a welding unit. In some embodiments, the target 502 includes a stationary structure to be detected by the sense element 104. Exemplary stationary structures includes tables and automobile bodies on an assembly line. In some embodiments, the stationary structure includes an arc welding unit.

In operation, the first circuit 102 and the second circuit 106 generate a substantially periodic signal. The target 502 is detected by the sense element 104. In some embodiments, the target 502 is coupled to the sense element 104 at detection time electromagnetically. When the substantially periodic signal is subjected to noise, the first circuit 102 and the second circuit 106 amplitude compensate the substantially periodic signal.

Figure 6:
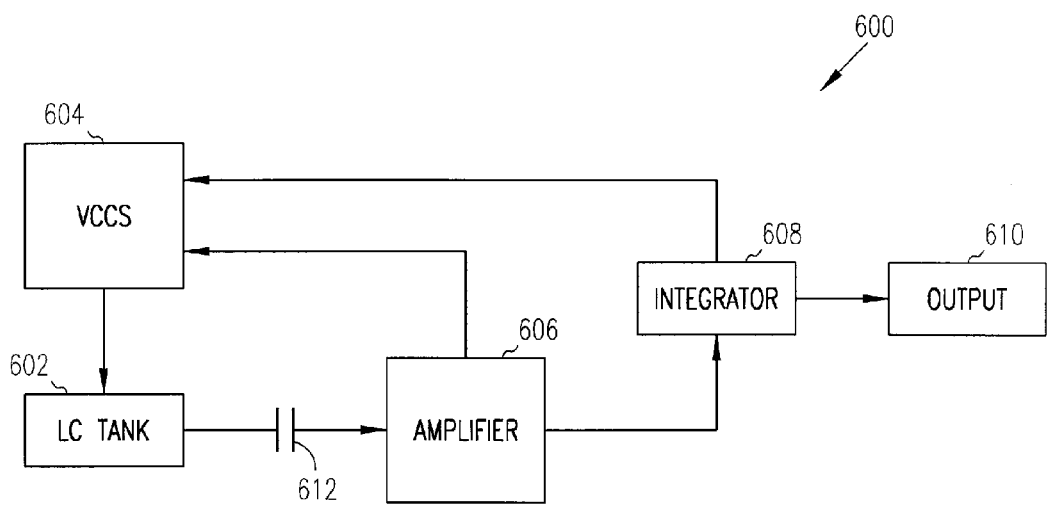
FIG. 6 illustrates a block diagram of an apparatus including an LC tank, a voltage controlled current source, an amplifier, an integrator, and an output circuit in accordance with one embodiment.

FIG. 6 illustrates a block diagram of an apparatus 600 including an LC tank 602, a voltage controlled current source 604, an amplifier 606, an integrator 608, and an output circuit 610 in accordance with one embodiment. The LC tank 602 is coupled to the voltage controlled current source 604 and the amplifier 606. The amplifier 606 is coupled to the voltage controlled current source 604 and the integrator 608. The integrator 608 is coupled to the voltage controlled current source 604 and the output circuit 610. In some embodiments, the amplifier 606 includes biasing. In some embodiments, a capacitor 612 couples the LC tank 602 to the amplifier 606.

In operation, the voltage controlled current source 604 drives the LC tank 602. An oscillation signal, such as a high frequency oscillation signal, formed across the LC tank 602 is coupled to the amplifier 606 by the capacitor 612. An induced sixty hertz voltage is blocked by the capacitor 612 or a highpass filter and will have substantially no effect on the amplifier 606 or any biasing circuits included with the amplifier 606. The output of the amplifier 602 is coupled to the voltage controlled current source 604 to control the voltage controlled current source 604 and to form a positive feedback loop required for oscillation. The direct current output of the integrator 608 is coupled to the voltage controlled current source 604 to control the current gain of the voltage controlled current source 604 and to form a second feed back loop. The purpose of the second feedback loop is to increase the current gain of the oscillator when the output of the integrator 608 is below a certain level (this level is below the trip level of the Schmitt trigger to avoid reducing sensor sensitivity to the target) to sustain the oscillation. This speeds up the oscillator and make it bounce up at a substantial rate for a sixty hertz alternating current field crossing zero. A delay circuit and a Schmitt trigger provide the apparatus 600 with magnetic field immunity.

The apparatus 600 provides substantial immunity to false trigger events caused by core saturation, such as ferrite core saturation, which damps the oscillator. The apparatus 600 also provides substantial immunity to false trigger events caused by induced voltage in the coil, which can change the operating point of the amplifier.

Figure 7:
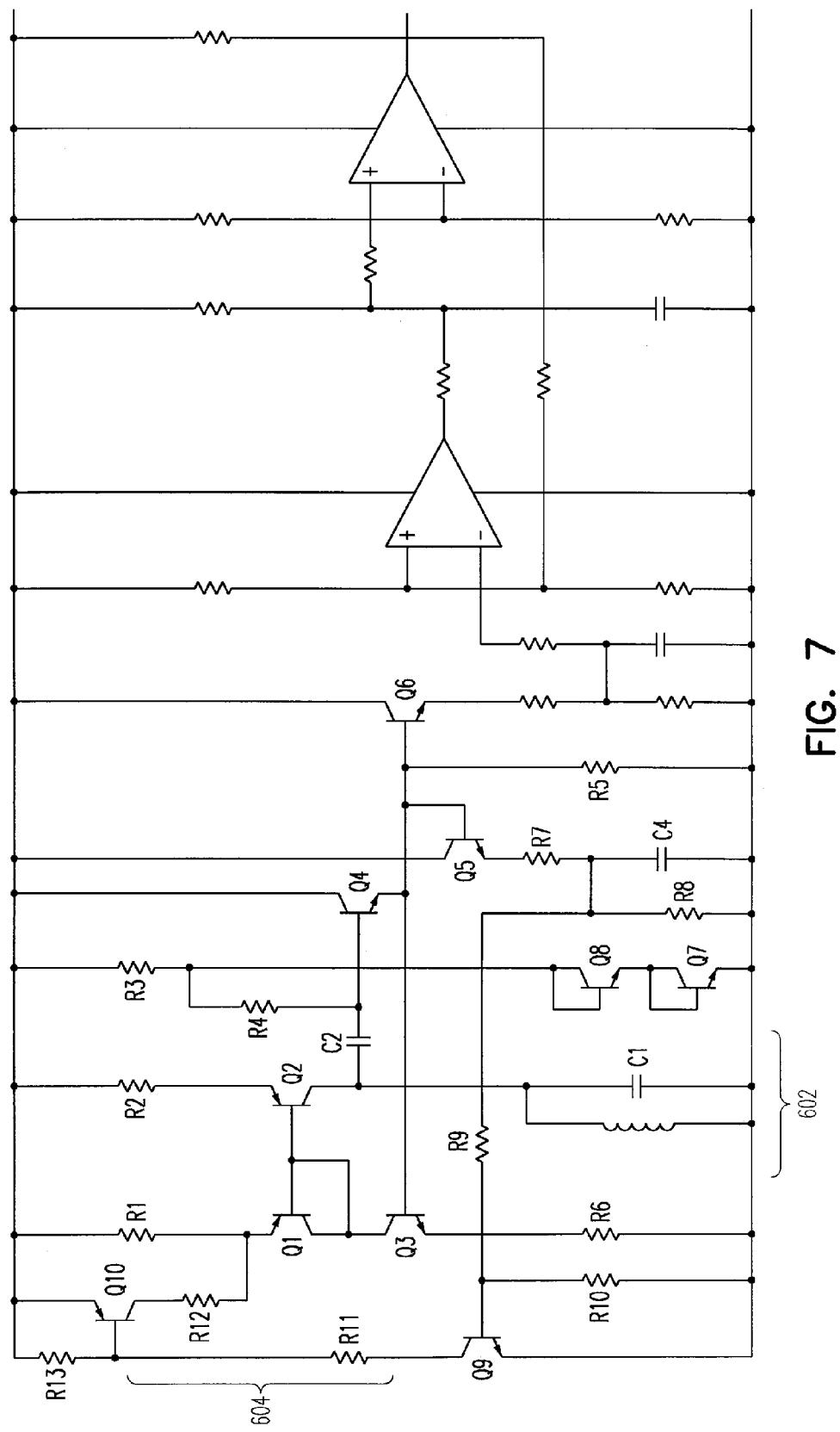
FIG. 7 illustrates a schematic diagram of the apparatus, shown in FIG. 6, in accordance with one embodiment.

FIG. 7 illustrates a schematic diagram of the apparatus, shown in FIG. 6, in accordance with one embodiment. Transistors Q1, Q2, and Q3, and resistors R1, R2, and R6 form the voltage controlled current source 604, shown in FIG. 6, to drive the LC tank 602, also shown in FIG. 6. Q4 and R5 form a voltage follower to provide positive feedback. Q7, Q8, R3, and R4 provide a direct current biasing for the voltage follower and Q3. C2 is operates as an alternating current coupler to block an induced sixty hertz alternating current voltage but allows high frequency oscillation signals to pass. Q5, R7, R8, and C4 form the an integrator to generate a direct current signal proportional to the amplitude of the oscillation signal. This direct current signal is coupled to the voltage controlled current source 604 to control the current gain of the voltage controlled current source 604 through circuits formed by Q9, Q10, R9, R1, R11, R12, and R13. The second integrator provides an output signal to a Schmitt trigger and a delay circuit. Use of two integrators allows for a separately adjustable time constant to achieve substantially useful dynamic behavior and to substantially avoid excess loop oscillation.

It is to be understood that the above description is intended to be illustrative, and not restrictive. Furthermore, it should be noted that the embodiments, and various options described above and illustrated in the drawings, may be selectively combined to form additional embodiments. Many other embodiments will be apparent to those of skill in the art upon reviewing the above description. The scope should, therefore, be determined with reference to the appended claims, along with the full scope of equivalents to which such claims are entitled.

What is claimed is:

1. An apparatus comprising:
   a first circuit including a sense element;
   a second circuit including an integrator;
   a capacitor to couple the first circuit to the second circuit, the capacitor coupled to the sense element;
   a first feedback path to couple the second circuit to the first circuit, the first feedback path separate from the capacitor; and
   a second feedback path to couple the second circuit to the first circuit, the second feedback path to couple the integrator to the first circuit, the second feedback path separate from the capacitor.

2. The apparatus of claim 1, the first circuit and the second circuit to produce a substantially periodic signal.

3. The apparatus of claim 2, wherein the sense element is connected in parallel with a capacitor.

4. The apparatus of claim 2, the second feedback path to provide an amplitude compensation signal to the first circuit.

5. The apparatus of claim 4, wherein the amplitude compensation signal comprises a substantially direct current signal.

6. The apparatus of claim 4, wherein the periodic signal has an amplitude and the amplitude compensation signal is related to the amplitude.

7. The apparatus of claim 4, the amplitude compensation signal to amplitude compensate the substantially periodic signal when noise or an alternating current or direct current magnetic field is detected in the sense element.

8. The apparatus of claim 1, the first feedback path to provide a substantially periodic signal to the first circuit.

9. The apparatus of claim 1, wherein the first circuit includes an integrator.

10. The apparatus of claim 1, the capacitor to block noise having a frequency of substantially sixty hertz.

11. The apparatus of claim 1, wherein the sense element comprises a coil including a magnetic core.

12. The apparatus of claim 11, wherein the magnetic core comprises a ferromagnetic material.

13. The apparatus of claim 1, wherein the first feedback path is arranged to couple the second circuit to a voltage controlled current source in the first circuit and the second feedback path is arranged to couple the second circuit to the voltage controlled current source.

14. The apparatus of claim 13, wherein the voltage controlled current source is coupled to the sense element.

15. An apparatus comprising:
a first circuit including a sense element;
a second circuit; and
a capacitor to couple the first circuit to the second circuit and a first feedback path to couple the second circuit to the first circuit and a second feedback path to couple the second circuit to the first circuit, the first circuit and the second circuit to produce a substantially periodic signal, the second feedback path to provide an amplitude compensation signal to the first circuit, the amplitude compensation signal to amplitude compensate the substantially periodic signal when noise or an alternating current or direct current magnetic field is detected in the sense element, wherein the noise or an alternating current magnetic field has a frequency of about sixty hertz.

16. A system comprising:
a first circuit including a sense element;
a second circuit including an integrator;
a capacitor to couple the first circuit to the second circuit, the capacitor coupled to the sense element;
a first feedback path to couple the second circuit to the first circuit, the first feedback path separate from the capacitor; and
a second feedback path to couple the second circuit to the first circuit, the second feedback path to couple the integrator to the first circuit, the second feedback path separate from the capacitor; and
a target detectable by the sense element.

17. The system of claim 16, wherein the target comprises a moveable structure to be detected by the sense element.

18. The system of claim 17, wherein the moveable structure includes a welding unit.

19. The system of claim 18, wherein the stationary structure comprises an arc welding unit.

20. The system of claim 16, wherein the target comprises a stationary structure to be detected by the sense element.

* * * * *